(12) United States Patent
Matsui et al.

(10) Patent No.: US 9,540,490 B2
(45) Date of Patent: Jan. 10, 2017

(54) CURABLE COMPOSITION, CURING PRODUCT, AND METHOD FOR USING CURABLE COMPOSITION

(71) Applicant: LINTEC CORPORATION, Tokyo (JP)

(72) Inventors: Masami Matsui, Tokyo (JP); Mikihiro Kashio, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 0 days.

(21) Appl. No.: 15/023,199

(22) PCT Filed: Sep. 19, 2014

(86) PCT No.: PCT/JP2014/074935
§ 371 (c)(1),
(2) Date: Mar. 18, 2016

(87) PCT Pub. No.: WO2015/041341
PCT Pub. Date: Mar. 26, 2015

(65) Prior Publication Data
US 2016/0229961 A1 Aug. 11, 2016

(30) Foreign Application Priority Data

Sep. 20, 2013 (JP) .................. 2013-195835

(51) Int. Cl.
C08G 77/26 (2006.01)
H01L 33/56 (2010.01)
C08L 83/08 (2006.01)
C09J 183/08 (2006.01)
C08G 77/04 (2006.01)
C08K 5/544 (2006.01)

(52) U.S. Cl.
CPC .............. *C08G 77/26* (2013.01); *C08L 83/08* (2013.01); *C09J 183/08* (2013.01); *H01L 33/56* (2013.01); *C08G 77/04* (2013.01); *C08K 5/5442* (2013.01); *H01L 2933/005* (2013.01)

(58) Field of Classification Search
None
See application file for complete search history.

(56) References Cited

U.S. PATENT DOCUMENTS 4,788,170 A * 11/1988 Wengrovius ........... B01J 31/122
502/150
8,399,592 B2 * 3/2013 Manabe .................... C07F 7/21
528/31
2005/0031791 A1 * 2/2005 Sasaki .................. C09D 183/14
427/372.2
2008/0020190 A1 * 1/2008 Nun ....................... E04F 13/002
428/210
2008/0051487 A1 * 2/2008 Kumon ................. C08F 283/12
522/146
2008/0210948 A1 * 9/2008 Sugawara ............... C08L 83/04
257/76
2009/0225640 A1 * 9/2009 Manabe ................. C08G 77/04
369/100
2014/0148536 A1 * 5/2014 Kawabata ................ C07F 7/21
524/101
2014/0187732 A1 * 7/2014 Rule ....................... C04B 26/32
528/12
2015/0065663 A1 * 3/2015 Matsui .................... C08K 5/544
525/477
2015/0099094 A1 * 4/2015 Suzuki .................... B05D 3/12
428/141
2016/0009970 A1 * 1/2016 Matsui ................. C08K 5/5435
524/588
2016/0108258 A1 * 4/2016 Masuda ............. C01G 23/0536
428/412

FOREIGN PATENT DOCUMENTS

JP 2004-359933 A 12/2004
JP 2005-263869 A 9/2005
JP 2006-328231 A 12/2006

OTHER PUBLICATIONS

International Search Report (PCT/ISA/210) issued in PCT/JP2014/074935, mailed on Oct. 21, 2014.
Written Opinion (PCT/ISA/237) issued in PCT/JP2014/074935, mailed on Oct. 21, 2014.

* cited by examiner

*Primary Examiner* — Robert S Loewe
(74) *Attorney, Agent, or Firm* — Birch, Stewart, Kolasch & Birch, LLP

(57) ABSTRACT

The present invention is: a curable composition comprising a component (A) and a component (B) in a mass ratio (component (A):component (B)) of 100:0.3 to 100:90, the component (A) being a silane compound polymer that is represented by a formula (a-1), wherein $R^1$ is a group selected from an alkyl group having 1 to 20 carbon atoms, a cycloalkyl group having 3 to 10 carbon atoms, and a substituted or unsubstituted aryl group having 6 to 20 carbon atoms, Z is a hydroxyl group, an alkoxy group having 1 to 10 carbon atoms, or a halogen atom, m is a positive integer, and n and o are independently 0 or a positive integer, provided that a plurality of $R^1$ are either identical or different, and a plurality of Z are either identical or different, and the component (B) being a silane coupling agent that comprises an isocyanurate skeleton in its molecule.

$$(R^1SiO_{3/2})_m(R^1SiZO_{2/2})_n(R^1SiZ_2O_{1/2})_o \quad \text{(a-1)}$$

9 Claims, No Drawings

CURABLE COMPOSITION, CURING PRODUCT, AND METHOD FOR USING CURABLE COMPOSITION

TECHNICAL FIELD

The present invention relates to a curable composition that produces a cured product that exhibits excellent transparency, heat resistance, and adhesion, and also exhibits excellent durability with respect to a change in temperature, a cured product obtained by curing the curable composition, and a method for using the curable composition as an optical device adhesive or an optical device sealing material.

BACKGROUND ART

A curable composition has been used as an optical device-securing composition (e.g., optical device adhesive or optical device sealing material) when producing a sealed optical device.

Examples of the optical device include a light-emitting device (e.g., laser (e.g., semiconductor laser diode (LD)) and light-emitting diode (LED)), a light-receiving device, a hybrid optical device, an optical integrated circuit, and the like. In recent years, an optical device that emits blue light or white light (i.e., an optical device that has a shorter emission peak wavelength) has been developed, and widely used. There is a tendency that the brightness of a light-emitting device having a short emission peak wavelength is significantly increased, and the amount of heat generated by such an optical device further increases.

Along with a recent increase in the brightness of an optical device, a cured product of an optical device-securing composition may deteriorate, and show a decrease in adhesion since the cured product is exposed to higher-energy light or higher-temperature (heat) generated by the optical device for a long time.

Patent Literature 1 to 3 propose an optical device-securing composition that includes a polysilsesquioxane compound as the main component in order to solve the above problem.

However, it may be difficult to obtain a cured product that exhibits sufficient heat resistance and transparency while maintaining sufficient adhesion using the optical device-securing compositions disclosed in Patent Literature 1 to 3 that include a polysilsesquioxane compound as the main component.

Along with a recent increase in the brightness and the lifetime of an optical device, an optical device-securing material used for an optical device has also been desired to exhibit excellent durability with respect to a change in temperature.

Therefore, development of a curable composition that produces a cured product that exhibits excellent transparency, heat resistance, and adhesion, and also exhibits excellent durability with respect to a change in temperature has been desired.

CITATION LIST

Patent Literature

Patent Literature 1: JP-A-2004-359933
Patent Literature 2: JP-A-2005-263869
Patent Literature 3: JP-A-2006-328231

SUMMARY OF INVENTION

Technical Problem

The invention was conceived in view of the above situation. An object of the invention is to provide a curable composition that produces a cured product that exhibits excellent transparency, heat resistance, and adhesion, and also exhibits excellent durability with respect to a change in temperature, a cured product obtained by curing the curable composition, and a method for using the curable composition as an optical device adhesive or an optical device sealing material.

Solution to Problem

The inventors of the invention have conducted extensive studies in order to solve the above problems. As a result, the inventors found that a composition that includes a specific silane compound polymer and a silane coupling agent that includes an isocyanurate skeleton in its molecule in a specific ratio, produces a cured product that exhibits excellent transparency, heat resistance, and adhesion, and also exhibits excellent durability with respect to a change in temperature. This finding has led to the completion of the invention.

Several aspects of the invention provide the following curable composition (see (1) to (5)), cured product (see (6) and (7)), and method for using a curable composition (see (8) and (9)).

(1) A curable composition including a component (A) and a component (B) in a mass ratio (component (A):component (B)) of 100:0.3 to 100:90, the component (A) being a silane compound polymer that is represented by the following formula (a-1),

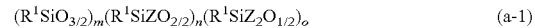

$$(R^1SiO_{3/2})_m(R^1SiZO_{2/2})_n(R^1SiZ_2O_{1/2})_o \quad \text{(a-1)}$$

wherein $R^1$ is a group selected from an alkyl group having 1 to 20 carbon atoms, a cycloalkyl group having 3 to 10 carbon atoms, and a substituted or unsubstituted aryl group having 6 to 20 carbon atoms, Z is a hydroxyl group, an alkoxy group having 1 to 10 carbon atoms, or a halogen atom, m is a positive integer, and n and o are independently 0 or a positive integer, provided that a plurality of $R^1$ are either identical or different, and a plurality of Z are either identical or different, and the component (B) being a silane coupling agent that includes an isocyanurate skeleton in its molecule.

(2) The curable composition according to (1), wherein the silane compound polymer used as the component (A) has a weight average molecular weight of 1,000 to 30,000.

(3) The curable composition according to (1), wherein the silane coupling agent used as the component (B) is a compound represented by the following formula (b-1) or (b-2),

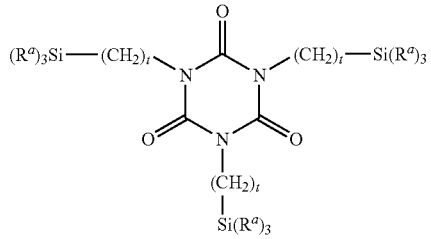

-continued (b-2)

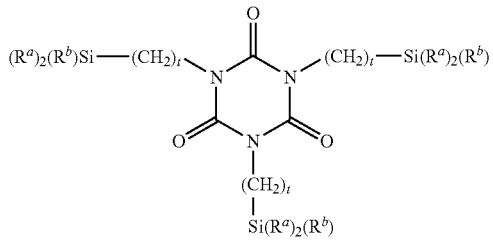

wherein $R^a$ are a hydroxyl group, an alkoxy group having 1 to 10 carbon atoms, or a halogen atom, $R^b$ are an alkyl group having 1 to 6 carbon atoms, or a substituted or unsubstituted aryl group, provided that $R^a$ are either identical or different, and $R^b$ are either identical or different, and t is an integer from 1 to 10.

(4) The curable composition according to (1), further including a component (C), the component (C) being a silane coupling agent that includes a urea structure in its molecule.

(5) The curable composition according to (1), the curable composition being an optical device-securing composition.

(6) A cured product obtained by curing the curable composition according to (1).

(7) The cured product according to (7), the cured product being an optical device-securing material.

(8) A method for using the curable composition according to (1) as an optical device-securing adhesive.

(9) A method for using the curable composition according to (1) as an optical device sealing material.

Advantageous Effects of Invention

The curable composition according to one aspect of the invention thus produces a cured product that exhibits excellent transparency, heat resistance, and adhesion, and also exhibits excellent durability with respect to a change in temperature.

The curable composition according to one aspect of the invention may be used to form an optical device-securing material, and may particularly suitably be used as an optical device adhesive and an optical device sealing material.

DESCRIPTION OF EMBODIMENTS

A curable composition, a cured product, and a method for using a curable composition according to the exemplary embodiments of the invention are described in detail below.

A curable composition according to one embodiment of the invention includes a component (A) and a component (B) (see below) in a mass ratio (component (A):component (B)) of 100:0.3 to 100:90.

Component (A) (Silane Compound Polymer (A))

The component (A) included in the curable composition according to one embodiment of the invention is a silane compound copolymer (A) that is represented by the following formula (a-1).

$(R^1SiO_{3/2})_m(R^1SiZO_{2/2})_n(R^1SiZ_2O_{1/2})_o$     (a-1)

The repeating unit represented by $—(R^1SiO_{3/2})—$ in the formula (a-1), the repeating unit represented by $—(R^1SiZO_{2/2})—$ in the formula (a-1), and the repeating unit represented by $—(R^1SiZ_2O_{1/2})—$ in the formula (a-1) are respectively represented by the following formulas (a11) to (a13). Note that "—O—" in the formulas (a11) to (a13) is an oxygen atom that is bonded to two Si atoms that are contiguous thereto.

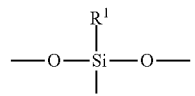

(a11)

(a12)

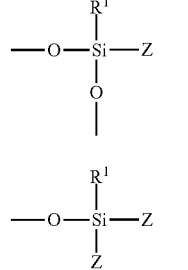

(a13)

In the formula (a-1), $R^1$ is a group selected from an alkyl group having 1 to 20 carbon atoms, a cycloalkyl group having 3 to 10 carbon atoms, and a substituted or unsubstituted aryl group having 6 to 20 carbon atoms, Z is a hydroxyl group, an alkoxy group having 1 to 10 carbon atoms, or a halogen atom, m is a positive integer, and n and o are independently 0 or a positive integer, provided that a plurality of $R^1$ are either identical or different, and a plurality of Z are either identical or different.

When m in the formula (a-1) is equal to or larger than 2, a plurality of repeating units represented by the formula (a11) are either the same or different. When n in the formula (a-1) is equal to or larger than 2, a plurality of repeating units represented by the formula (a12) are either the same or different. When o in the formula (a-1) is equal to or larger than 2, a plurality of repeating units represented by the formula (a13) are either the same or different.

Examples of the alkyl group having 1 to 20 carbon atoms that may be represented by $R^1$ include a methyl group, an ethyl group, an n-propyl group, an isopropyl group, an n-butyl group, an s-butyl group, an isobutyl group, a t-butyl group, an n-pentyl group, an n-hexyl group, an n-octyl group, an isooctyl group, an n-nonyl group, an n-decyl group, an n-dodecyl group, and the like.

Examples of the cycloalkyl group having 3 to 10 carbon atoms that may be represented by $R^1$ include a cyclopropyl group, a cyclobutyl group, a cyclopentyl group, a cyclohexyl group, a cycloheptyl group, a cyclooctyl group, and the like.

Examples of the aryl group having 6 to 20 carbon atoms (that is either substituted or unsubstituted) that may be represented by $R^1$ include a phenyl group, a 1-naphthyl group, a 2-naphthyl group, and the like. Examples of a substituent that may substitute the aryl group include an alkyl group such as a methyl group, an ethyl group, an n-propyl group, and a t-butyl group; a halogen atom such as a fluorine atom and a chlorine atom; an alkoxy group such as a methoxy group and an ethoxy group; and the like.

$R^1$ is preferably an alkyl group having 1 to 20 carbon atoms, and more preferably an alkyl group having 1 to 10 carbon atoms.

Z is a hydroxyl group, an alkoxy group having 1 to 10 carbon atoms, or a halogen atom.

Examples of the alkoxy group having 1 to 10 carbon atoms include a methoxy group, an ethoxy group, a propoxy group, an isopropoxy group, an n-butoxy group, a t-butoxy group, and the like.

Examples of the halogen atom include a chlorine atom, a bromine atom, and the like.

Z is preferably a hydroxyl group or an alkoxy group having 1 to 10 carbon atoms, and more preferably a hydroxyl group or an alkoxy group having 1 to 6 carbon atoms.

m is a positive integer, and n and o are independently 0 or a positive integer.

The silane compound polymer (A) may be a homopolymer (i.e., a polymer in which $R^1$ are identical), or may be a copolymer (i.e., a polymer in which $R^1$ are different).

When the silane compound polymer (A) is a copolymer, the silane compound polymer (A) may be a random copolymer, a block copolymer, a graft copolymer, an alternating copolymer, or the like. The silane compound polymer (A) may have a ladder-like structure, a double decker-like structure, a basket-like structure, a partially cleaved basket-like structure, a cyclic structure, or a random structure.

The weight average molecular weight (Mw) of the silane compound polymer (A) is preferably 1,000 to 30,000, more preferably 1,200 to 20,000, and particularly preferably 1,500 to 15,000. When the weight average molecular weight of the silane compound polymer (A) is within the above range, it is possible to obtain a curable composition that produces a cured product that exhibits better transparency, heat resistance, and adhesion.

The weight average molecular weight (Mw) of the silane compound polymer (A) may be determined as a standard polystyrene-equivalent value by gel permeation chromatography (GPC) that utilizes tetrahydrofuran (THF) as a solvent, for example.

The molecular weight distribution (Mw/Mn) of the silane compound polymer (A) is not particularly limited, but is normally 1.0 to 8.0, preferably 1.5 to 7.0, and particularly preferably 3.0 to 6.0. When the molecular weight distribution of the silane compound polymer (A) is within the above range, it is possible to obtain a curable composition that produces a cured product that exhibits better transparency, heat resistance, and adhesion.

Note that only one type of the silane compound polymer (A) may be used, or two or more types of the silane compound polymer (A) may be used in combination.

The silane compound polymer (A) may be produced using an arbitrary method. For example, the silane compound polymer (A) may be produced by condensing a silane compound (1) represented by the formula (1): $R^1Si(OR^2)_u(X^1)_{3-u}$. Note that the term "condensation" is used herein in a broad sense, and includes hydrolysis and polycondensation.

$R^1$ in the formula (1) is the same as defined above. $R^2$ is an alkyl group having 1 to 10 carbon atoms, $X^1$ is a halogen atom, and u is an integer from 0 to 3.

Examples of the alkyl group having 1 to 10 carbon atoms represented by $R^2$ include a methyl group, an ethyl group, an n-propyl group, an isopropyl group, an n-butyl group, an s-butyl group, an isobutyl group, a t-butyl group, and the like.

Examples of the halogen atom represented by $X^1$ include a chlorine atom, a bromine atom, and the like.

When u is equal to or larger than 2, a plurality of $OR^2$ are either identical or different. When (3-u) is equal to or larger than 2, a plurality of $X^1$ are either identical or different.

Specific examples of the silane compound (1) include an alkyltrialkoxysilane compound such as methyltrimethoxysilane, methyltriethoxysilane, ethyltrimethoxysilane, ethyltriethoxysilane, ethyltripropoxysilane, n-propyltrimethoxysilane, n-propyltriethoxysilane, n-propyltripropoxysilane, n-propyltributoxysilane, n-butyltrimethoxysilane, isobutyltrimethoxysilane, n-pentyltrimethoxysilane, n-hexyltrimethoxysilane, and isooctyltriethoxysilane; a cycloalkyltrialkoxysilane compound such as cyclopropyltrimethoxysilane, cyclopropyltriethoxysilane, cyclopropyltripropoxysilane, cyclobutyltrimethoxysilane, cyclobutyltriethoxysilane, cyclobutyltripropoxysilane, cyclopentyltrimethoxysilane, cyclopentyltriethoxysilane, cyclopentyltripropoxysilane, cyclohexyltrimethoxysilane, cyclohexyltriethoxysilane, cyclohexyltripropoxysilane, cyclooctyltrimethoxysilane, cyclooctyltriethoxysilane, and cyclooctyltripropoxysilane;

an aryltrialkoxysilane compound such as phenyltrimethoxysilane, phenyltriethoxysilane, phenyltripropoxysilane, naphthyltrimethoxysilane, naphthyltriethoxysilane, naphthyltripropoxysilane, 4-methylphenyltrimethoxysilane, 4-methylphenyltriethoxysilane, 4-methylphenyltripropoxysilane, and 2-chlorophenyltrimethoxysilane;

an alkylhalogenoalkoxysilane compound such as methylchlorodimethoxysilane, methylchlorodiethoxysilane, methyldichloromethoxysilane, methylbromodimethoxysilane, ethylchlorodimethoxysilane, ethylchlorodiethoxysilane, ethyldichloromethoxysilane, ethylbromodimethoxysilane, n-propylchlorodimethoxysilane, n-propyldichloromethoxysilane, n-butylchlorodimethoxysilane, and n-butyldichloromethoxysilane;

a cycloalkylhalogenoalkoxysilane compound such as cyclopropylchlorodimethoxysilane, cyclopropylchlorodiethoxysilane, cyclopropyldichloromethoxysilane, cyclopropylbromodimethoxysilane, cyclobutylchlorodimethoxysilane, cyclobutylchlorodiethoxysilane, cyclobutyldichloromethoxysilane, cyclobutylbromodimethoxysilane, cyclopentylchlorodimethoxysilane, cyclohexylchlorodimethoxysilane, and cyclooctylchlorodimethoxysilane;

an arylhalogenoalkoxysilane compound such as phenylchlorodimethoxysilane, phenylchlorodiethoxysilane, phenyldichloromethoxysilane, phenylbromodimethoxysilane, naphthylchlorodimethoxysilane, naphthylchlorodiethoxysilane, naphthyldichloromethoxysilane, naphthylbromodimethoxysilane, 4-methylphenylchlorodimethoxysilane, 4-methylphenyldichloromethoxysilane, 4-methylphenylbromodimethoxysilane, and 2-chlorophenylchlorodimethoxysilane;

an alkyltrihalogenosilane compound such as methyltrichlorosilane, methyltribromosilane, ethyltrichlorosilane, ethyltribromosilane, n-propyltrichlorosilane, n-propyltribromosilane, n-butyltrichlorosilane, isobutyltrichlorosilane, n-pentyltrichlorosilane, n-hexyltrichlorosilane, and isooctyltrichlorosilane;

a cycloalkyltrihalogenosilane compound such as cyclopropyltrichlorosilane, cyclopropyltribromosilane, cyclobutyltrichlorosilane, cyclobutyltribromosilane, cyclopentyltrichlorosilane, cyclopentyltribromosilane, cyclohexyltrichlorosilane, cyclohexyltribromosilane, cyclooctyltrichlorosilane, and cyclooctyltribromosilane;

an aryltrihalogenosilane compound such as phenyltrichlorosilane, phenyltribromosilane, naphthyltrichlorosilane, naphthyltribromosilane, 4-methylphenyltrichlorosilane, 4-methylphenyltribromosilane, and 2-chlorophenyltrichlorosilane; and the like.

These silane compounds (1) may be used either alone or in combination.

An alkyltrialkoxysilane compound, a cycloalkyltrialkoxysilane compound, and an aryltrialkoxysilane compound are preferable as the silane compound (1) since a curable composition that produces a cured product that exhibits better adhesion can be obtained.

The silane compound (1) may be condensed using an arbitrary method. For example, the silane compound (1) may be condensed by dissolving the silane compound (1) in a solvent, adding a given amount of catalyst to the solution, and stirring the mixture at a given temperature.

An acid catalyst or a base catalyst may be used as the catalyst.

Examples of the acid catalyst include an inorganic acid such as hydrochloric acid, sulfuric acid, nitric acid, and phosphoric acid; an organic acid such as methanesulfonic acid, trifluoromethanesulfonic acid, benzenesulfonic acid, p-toluenesulfonic acid, acetic acid, and trifluoroacetic acid; and the like.

Examples of the base catalyst include an organic base such as aqueous ammonia, trimethylamine, triethylamine, lithium diisopropylamide, lithium bis(trimethylsilyl)amide, pyridine, 1,8-diazabicyclo[5.4.0]-7-undecene, aniline, picoline, 1,4-diazabicyclo[2.2.2]octane, and imidazole; an organic base hydroxide such as tetramethylammonium hydroxide and tetraethylammonium hydroxide; a metal alkoxide such as sodium methoxide, sodium ethoxide, sodium t-butoxide, and potassium t-butoxide; a metal hydride such as sodium hydride and calcium hydride; a metal hydroxide such as sodium hydroxide, potassium hydroxide, and calcium hydroxide; a metal carbonate such as sodium carbonate, potassium carbonate, and magnesium carbonate; a metal hydrogen carbonate such as sodium hydrogen carbonate and potassium hydrogen carbonate; and the like.

The catalyst is normally used in a ratio of 0.1 to 10 mol %, and preferably 1 to 5 mol %, based on the total number of moles of the silane compound(s).

The solvent may be appropriately selected taking account of the type of silane compound and the like. Examples of the solvent include water; an aromatic hydrocarbon such as benzene, toluene, and xylene; an ester such as methyl acetate, ethyl acetate, propyl acetate, and methyl propionate; a ketone such as acetone, methyl ethyl ketone, methyl isobutyl ketone, and cyclohexanone; an alcohol such as methyl alcohol, ethyl alcohol, n-propyl alcohol, isopropyl alcohol, n-butyl alcohol, isobutyl alcohol, s-butyl alcohol, and t-butyl alcohol; and the like. These solvents may be used either alone or in combination.

The solvent is normally used so that the total number of moles of the silane compound(s) is 0.1 to 10 mol, and preferably 0.5 to 10 mol, per liter of the solvent.

The silane compound is normally condensed (reacted) in a temperature range from 0° C. to the boiling point of the solvent (preferably 20 to 100° C.). If the reaction temperature is too low, condensation (condensation reaction) may not proceed sufficiently. If the reaction temperature is too high, it may be difficult to suppress gelation. The reaction is normally completed within 30 minutes to 20 hours.

After completion of the reaction, the mixture is neutralized by adding an aqueous solution of an alkali (e.g., sodium hydrogen carbonate) when using the acid catalyst, or neutralized by adding an acid (e.g., hydrochloric acid) when using the base catalyst. Salts produced during neutralization are removed by filtration, washing with water, or the like to obtain the target silane compound polymer.

When the silane compound polymer (A) is produced using the above method, $OR^2$ or $X^1$ included in the silane compound (1) remains in the silane compound polymer (A) when $OR^2$ or $X^1$ has not been subjected to dehydration and/or dealcoholization. Specifically, when one $OR^2$ or $X^1$ remains in the silane compound polymer (A), the one $OR^2$ or $X^1$ remains in the silane compound polymer (A) represented by the formula (a-1) as $(CHR^1X^0\text{-}D\text{-}SiZO_{2/2})$. When two $OR^2$ or $X^1$ remain in the silane compound polymer (A), the two $OR^2$ or $X^1$ remain in the silane compound polymer (A) represented by the formula (a-1) as $(CHR^1X^0\text{-}D\text{-}SiZ_2O_{1/2})$.

Component (B) (Silane Coupling Agent that Includes an Isocyanurate Skeleton in its Molecule)

The curable composition according to one embodiment of the invention includes a silane coupling agent that includes an isocyanurate skeleton in its molecule (hereinafter may be referred to as "silane coupling agent (B)") as the component (B). The curable composition according to one embodiment of the invention that includes the silane coupling agent (B) produces a cured product that exhibits excellent transparency, heat resistance, and adhesion, and also exhibits excellent durability with respect to a change in temperature.

The silane coupling agent (B) is not particularly limited as long as the silane coupling agent (B) has an isocyanurate skeleton in its molecule. The term "isocyanurate skeleton" used herein refers to the skeleton represented by the following formula.

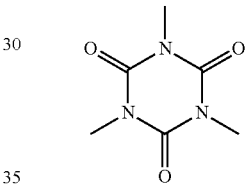

Examples of the silane coupling agent (B) include a silane coupling agent represented by the following formula (b-1) and a silane coupling agent represented by the following formula (b-2).

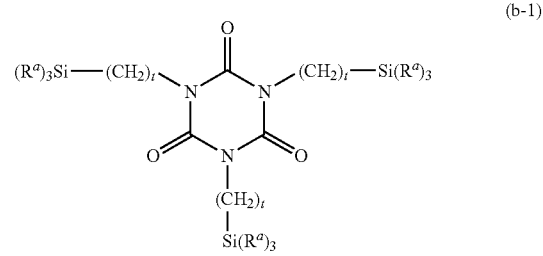

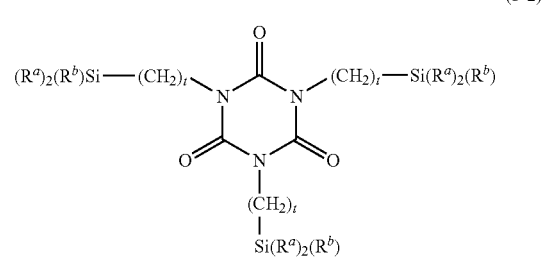

$R^a$ are a hydroxyl group, an alkoxy group having 1 to 10 carbon atoms, or a halogen atom. A plurality of $R^a$ are either identical or different.

Examples of the alkoxy group having 1 to 10 carbon atoms include a methoxy group, an ethoxy group, an n-propoxy group, an isopropoxy group, an n-butoxy group, an s-butoxy group, an isobutoxy group, a t-butoxy group, and the like.

Examples of the halogen atom include a chlorine atom, a bromine atom, and the like.

$R^a$ is preferably an alkoxy group having 1 to 10 carbon atoms, and more preferably an alkoxy group having 1 to 6 carbon atoms.

$R^b$ is an alkyl group having 1 to 6 carbon atoms, or a substituted or unsubstituted aryl group. A plurality of $R^b$ are either identical or different.

Examples of the alkyl group having 1 to 6 carbon atoms include a methyl group, an ethyl group, an n-propyl group, an isopropyl group, an n-butyl group, a t-butyl group, and the like.

Examples of the substituted or unsubstituted aryl group include a phenyl group, a 4-chlorophenyl group, a 4-methylphenyl group, and the like.

t are independently an integer from 1 to 10, preferably an integer from 1 to 6, and particularly preferably 3.

The groups represented by —$(CH_2)_t$—$Si(R^a)_3$ are either identical or different, and the groups represented by —$(CH_2)_t$—$Si(R^a)_2(R^b)$ are either identical or different.

Specific examples of the compound represented by the formula (b-1) include a 1,3,5-N-tris[(tri($C_{1-6}$)alkoxy)silyl($C_{1-10}$)alkyl)]isocyanurate such as 1,3,5-N-tris(3-trimethoxysilylpropyl) isocyanurate, 1,3,5-N-tris(3-triethoxysilylpropyl) isocyanurate, 1,3,5-N-tris(3-trisoipropoxysilylpropyl) isocyanurate, and 1,3,5-N-tris(3-tributoxysilylpropyl) isocyanurate, and the like.

Specific examples of the compound represented by the formula (b-2) include a 1,3,5-N-tris[(di($C_{1-6}$)alkoxy)(($C_{1-6}$)alkyl)silyl($C_{1-10}$)alkyl)] isocyanurate such as 1,3,5-N-tris(3-dimethoxymethylsilylpropyl) isocyanurate, 1,3,5-N-tris(3-dimethoxyethylsilylpropyl) isocyanurate, 1,3,5-N-tris(3-dimethoxyisopropylsilylpropyl) isocyanurate, 1,3,5-N-tris(3-dimethoxy-n-propylsilylpropyl) isocyanurate, 1,3,5-N-tris(3-diethoxymethylsilylpropyl) isocyanurate, 1,3,5-N-tris(3-diethoxyethylsilylpropyl) isocyanurate, 1,3,5-N-tris(3-diethoxyisopropylsilylpropyl) isocyanurate, 1,3,5-N-tris(3-diethoxy-n-propylsilylpropyl) isocyanurate, 1,3,5-N-tris(3-diisopropoxymethylsilylpropyl) isocyanurate, 1,3,5-N-tris(3-diisopropoxyethylsilylpropyl) isocyanurate, 1,3,5-N-tris(3-diisopropoxyisopropylsilylpropyl) isocyanurate, 1,3,5-N-tris(3-diisopropoxy-n-propylsilylpropyl) isocyanurate, 1,3,5-N-tris(3-dibutoxymethylsilylpropyl) isocyanurate, 1,3,5-N-tris(3-dibutoxyethylsilylpropyl) isocyanurate, 1,3,5-N-tris(3-dibutoxyisopropylsilylpropyl) isocyanurate, and 1,3,5-N-tris(3-dibutoxy-n-propylsilylpropyl) isocyanurate; a 1,3,5-N-tris[(di($C_{1-6}$)alkoxy)(($C_{6-20}$)aryl)silyl($C_{1-10}$)alkyl] isocyanurate such as 1,3,5-N-tris(3-dimethoxyphenylsilylpropyl) isocyanurate, 1,3,5-N-tris(3-diethoxyphenylsilylpropyl) isocyanurate, 1,3,5-N-tris(3-diisopropoxyphenylsilylpropyl) isocyanurate, and 1,3,5-N-tris(3-dibutoxyphenylsilylpropyl) isocyanurate; a 1,3,5-N-tris(trihalogenosilyl($C_{1-10}$)alkyl) isocyanurate such as 1,3,5-N-tris(3-trichlorosilylpropyl) isocyanurate and 1,3,5-N-tris(3-trichlorosilylpropyl) isocyanurate; and the like.

It is preferable to use the compound represented by the formula (b-1) as the component (B). It is more preferable to use 1,3,5-N-tris(3-trimethoxysilylpropyl) isocyanurate or 1,3,5-N-tris(3-triethoxysilylpropyl) isocyanurate as the component (B).

These silane coupling agents (B) may be used either alone or in combination.

The curable composition includes the component (A) and the component (B) in a mass ratio (component (A):component (B)) of 100:0.3 to 100:90, preferably 100:2 to 100:55, and particularly preferably 100:5 to 100:20.

The curable composition according to one embodiment of the invention that includes the component (A) and the component (B) in a mass ratio within the above range produces a cured product that exhibits excellent transparency, heat resistance, and adhesion, and also exhibits excellent durability with respect to a change in temperature.

The curable composition according to one embodiment of the invention may include an additional component other than the above components as long as the object of the invention is not impaired.

Examples of the additional component include a component (C) (i.e., a silane coupling agent that includes a urea structure in its molecule) (see below), an antioxidant, a UV absorber, a light stabilizer, a diluent, and the like.

The component (C) is a silane coupling agent that includes a urea structure in its molecule (hereinafter may be referred to as "silane coupling agent (C)").

The curable composition that includes the component (C) in addition to the component (B) produces a cured product that exhibits better transparency, heat resistance, and adhesion.

The silane coupling agent (C) is not particularly limited as long as the silane coupling agent (C) includes a urea structure in its molecule. The term "urea structure" used herein refers to the structure represented by —NH—CO—NH—.

Examples of the silane coupling agent (C) include a silane coupling agent represented by the following formula (c-1) and a silane coupling agent represented by the following formula (c-2).

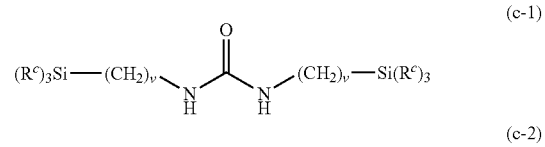

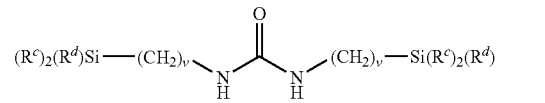

$R^c$ are a hydroxyl group, an alkoxy group having 1 to 10 carbon atoms, or a halogen atom. A plurality of $R^c$ are either identical or different.

Specific examples of the alkoxy group having 1 to 10 carbon atoms and the halogen atom include those mentioned above in connection with $R^a$ in the formulas (b-1) and (b-2).

$R^c$ is preferably an alkoxy group having 1 to 10 carbon atoms, and more preferably an alkoxy group having 1 to 6 carbon atoms.

$R^d$ is an alkyl group having 1 to 6 carbon atoms, or a substituted or unsubstituted aryl group. Specific examples of these groups include those mentioned above in connection with $R^b$ in the formulas (b-1) and (b-2).

v are independently an integer from 1 to 10, preferably an integer from 1 to 6, and particularly preferably 3.

The groups represented by —$(CH_2)_v$—$Si(R^c)_3$ are either identical or different, and the groups represented by —$(CH_2)_v$—$Si(R^c)_2(R^d)$ are either identical or different.

Specific examples of the compound represented by the formula (c-1) include an N,N'-bis[(tri($C_{1-6}$)alkoxysilyl)($C_{1-10}$)alkyl]urea such as N,N'-bis(3-trimethoxysilylpropyl)urea, N,N'-bis(3-triethoxysilylpropyl)urea, N,N'-bis(3-tripropoxysilylpropyl)urea, N,N'-bis(3-tributoxysilylpropyl)urea, and N,N'-bis(2-trimethoxysilylethyl)urea; an N,N'-bis(trihalogenosilyl($C_{1-10}$)alkyl)urea such as N,N'-bis(3-trichlorosilylpropyl)urea and N,N'-bis(3-tribromosilylpropyl)urea; and the like.

Specific examples of the compound represented by the formula (c-2) include an N,N'-bis(di($C_{1-6}$)alkoxy($C_{1-6}$)alkylsilyl($C_{1-10}$)alkyl)urea such as N,N'-bis(3-dimethoxymethylsilylpropyl)urea, N,N'-bis(3-dimethoxyethylsilylpropyl)urea, and N,N'-bis(3-diethoxymethylsilylpropyl)urea; an N,N'-bis(di($C_{1-6}$)alkoxy($C_{6-20}$)arylsilyl($C_{1-10}$)alkyl)urea such as N,N'-bis(3-dimethoxyphenylsilylpropyl)urea and N,N'-bis(3-diethoxyphenylsilylpropyl)urea; an N,N'-bis(dihalogeno($C_{1-6}$)alkylsilyl($C_{1-10}$)alkyl)urea such as N,N'-bis(3-dichloromethylsilylpropyl)urea; an N,N'-bis(dihalogeno($C_{6-20}$)arylsilyl($C_{1-10}$)alkyl)urea such as N,N'-bis(3-dichlorophenylsilylpropyl)urea; and the like.

These components (C) may be used either alone or in combination.

It is preferable to use the compound represented by the formula (c-1) as the component (C). It is more preferable to use N,N'-bis(3-trimethoxysilylpropyl)urea or N,N'-bis(3-triethoxysilylpropyl)urea as the component (C).

The component (C) is preferably used so that the mass ratio (component (A):component (C)) is 100:0.3 to 100:30, and more preferably 100:5 to 100:20.

The curable composition according to one embodiment of the invention that includes the component (C) in a mass ratio within the above range produces a cured product that exhibits better transparency, heat resistance, and adhesion, and also exhibits excellent durability with respect to a change in temperature.

The antioxidant is added to the curable composition in order to prevent deterioration due to oxidation during heating. Examples of the antioxidant include a phosphorus-based antioxidant, a phenol-based antioxidant, a sulfur-based antioxidant, and the like.

Examples of the phosphorus-based antioxidant include a phosphite, an oxaphosphaphenanthrene oxide, and the like.

Examples of the phenol-based antioxidant include a monophenol, a bisphenol, a polyphenol, and the like.

Examples of the sulfur-based antioxidant include dilauryl 3,3'-thiodipropionate, dimyristyl 3,3'-thiodipropionate, distearyl 3,3'-thiodipropionate, and the like.

These antioxidants may be used either alone or in combination. The antioxidant is normally used in a ratio of 10 mass % or less based on the component (A).

The UV absorber is added to the curable composition in order to improve the light resistance of the resulting cured product.

Examples of the UV absorber include a salicylic acid, a benzophenone, a benzotriazole, a hindered amine, and the like.

These UV absorbers may be used either alone or in combination.

The UV absorber is normally used in a ratio of 10 mass % or less based on the component (A).

The light stabilizer is added to the curable composition in order to improve the light resistance of the resulting cured product.

Examples of the light stabilizer include a hindered amine such as poly[{6-(1,1,3,3-tetramethylbutyl)amino-1,3,5-triazine-2,4-diyl}{(2,2,6,6-tetramethyl-4-piperidine)imino}hexamethylene{(2,2,6,6-tetramethyl-4-piperidine)imino}], and the like.

These light stabilizers may be used either alone or in combination.

The light stabilizer is normally used in a ratio of 10 mass % or less based on the component (A).

The diluent is added to the curable composition in order to adjust the viscosity of the curable composition.

Examples of the diluent include glycerol diglycidyl ether, butanediol diglycidyl ether, diglycidylaniline, neopentyl glycol glycidyl ether, cyclohexanedimethanol diglycidyl ether, an alkylene diglycidyl ether, polyglycol diglycidyl ether, polypropylene glycol diglycidyl ether, trimethylolpropane triglycidyl ether, glycerol triglycidyl ether, 4-vinylcyclohexene monooxide, vinylcyclohexene dioxide, methylated vinylcyclohexene dioxide, and the like.

These diluents may be used either alone or in combination.

The curable composition according to one embodiment of the invention may be prepared by mixing the component (A), the component (B), and an optional additional component in a given ratio, and defoaming the mixture using a known method, for example.

The curable composition according to one embodiment of the invention thus prepared produces a cured product that maintains excellent transparency and high adhesion for a long time even when exposed to high-energy light or high temperature, and exhibits excellent durability with respect to a change in temperature.

Therefore, the curable composition according to one embodiment of the invention is suitably used as a raw material for producing an optical part or a formed article, an adhesive, a coating material, and the like. Since the curable composition according to one embodiment of the invention can reduce or suppress deterioration in an optical device-securing material due to an increase in brightness of the optical device, the curable composition may suitably be used as an optical device-securing composition.

2) Cured Product

A cured product according to one embodiment of the invention is obtained by curing the curable composition according to one embodiment of the invention.

The curable composition according to one embodiment of the invention may be cured by heating the curable composition. The heating temperature when curing the curable composition is normally set to 100 to 200° C., and the heating time when curing the curable composition is normally set to 10 minutes to 20 hours, and preferably 30 minutes to 10 hours.

The cured product according to one embodiment of the invention exhibits excellent transparency, heat resistance, and adhesion, and also exhibits excellent durability with respect to a change in temperature.

Whether or not the cured product exhibits excellent transparency may be determined by measuring the light transmittance of the cured product. The light transmittance (initial transmittance) of the cured product is preferably 80% or more with respect to light having a wavelength of 400 nm or 450 nm, for example.

The cured product exhibits excellent heat resistance since the cured product shows only a small change in transparency even when subjected to a high temperature. It is preferable that the cured product have a transmittance (wavelength: 400 nm or 450 nm) of 80% or more with respect to the initial transmittance when heated at 150° C. for 500 hours. The initial transmittance and the post-heating transmittance of the cured product may be measured using the test method described in connection with the examples.

The cured product according to one embodiment of the invention exhibits high adhesion when the adhesion of the cured product is measured as described below, for example. Specifically, the curable composition is applied to a mirror surface of a silicon chip. The surface of the silicon chip to which the curable composition is applied is placed on an adherend, and compression-bonded to the adherend, and the curable composition is cured by heating. After allowing the resulting product to stand for 30 seconds on the measurement stage of a bond tester that has been heated to a given temperature (e.g., 23° C. or 100° C.), the adhesion between the specimen and the adherend is measured while applying stress to the bonding surface in the horizontal direction (shear direction) at a height of 50 μm above the adherend.

It is preferable that the cured product have an adhesion at 23° C. of 40 N/2 mm square or more, and have an adhesion at 100° C. of 20 N/2 mm square or more.

Whether or not the cured product according to one embodiment of the invention exhibits excellent durability with respect to a change in temperature may be determined by preparing a specimen-bonded adherend in the same manner as in the case of measuring the adhesion, subjecting the specimen-bonded adherend to a heat cycle test, and measuring the adhesion in the same manner as described above.

Specifically, the specimen-bonded adherend is subjected to the heat cycle test in 100 cycles (one cycle consists of an operation that holds the specimen-bonded adherend at −40° C. for 30 minutes, and then holds the specimen-bonded adherend at 100° C. for 30 minutes), and the adhesion between the specimen and the adherend is measured at 23° C. It is preferable that the adhesion thus measured be 30% or more, and more preferably 60% or more, with respect to the adhesion of the specimen at 23° C. that has not been subjected to the heat cycle test.

The cured product according to one embodiment of the invention is suitably used as a raw material for producing an optical part or a formed article, an adhesive, a coating material, a sealing material, and the like. Since the cured product according to one embodiment of the invention can reduce or suppress deterioration in an optical device-securing material due to an increase in the brightness of an optical device, the cured product can suitably be used as an optical device-securing material.

3) Method for Using Curable Composition

A method for using a curable composition according to one embodiment of the invention includes using the curable composition according to one embodiment of the invention as an optical device-securing composition such as an optical device adhesive or an optical device sealing material.

Examples of the optical device include a light-emitting device (e.g., LED and LD), a light-receiving device, a hybrid optical device, an optical integrated circuit, and the like.

Optical Device Adhesive

The curable composition according to one embodiment of the invention may suitably be used as an optical device adhesive.

When using the curable composition according to one embodiment of the invention as an optical device adhesive, the curable composition may be applied to the bonding surface of either or both of the bonding target materials (e.g., an optical device and a substrate), for example. The bonding target materials may be compression-bonded, and the curable composition may be cured by heating to firmly bond the bonding target materials.

Examples of a material for forming the substrate to which the optical device is bonded, include glass (e.g., soda lime glass and heat-resistant hard glass); a ceramic; a metal (e.g., iron, copper, aluminum, gold, silver, platinum, chromium, titanium, alloys thereof, and stainless steel (e.g., SUS302, SUS304, SUS304L, and SUS309)); a synthetic resin (e.g., polyethylene terephthalate, polybutylene terephthalate, polyethylene naphthalate, ethylene-vinyl acetate copolymer, polystyrene, polycarbonate, polymethylpentene, polysulfone, polyether ether ketone, polyether sulfone, polyphenylene sulfide, polyetherimide, polyimide, polyamide, acrylic resin, norbornene resin, cycloolefin resin, and glass epoxy resin); and the like.

The heating temperature when curing the curable composition is determined taking account of the type of curable composition and the like, but is normally 100 to 200° C. The heating time is normally 10 minutes to 20 hours, and preferably 30 minutes to 10 hours.

Optical Device Sealing Material

The curable composition according to one embodiment of the invention may suitably be used as an optical device sealing material.

When using the curable composition according to one embodiment of the invention as an optical device sealing material, the curable composition may be formed to have the desired shape to obtain a formed article that includes an optical device, and the formed article may be cured by heating to produce a sealed optical device, for example.

The curable composition according to one embodiment of the invention may be formed using an arbitrary method to have the desired shape. A known molding method such as a transfer molding method or a casting method may be used.

The heating temperature when curing the formed article (curable composition) is determined taking account of the type of curable composition and the like, but is normally 100 to 200° C. The heating time is normally 10 minutes to 20 hours, and preferably 30 minutes to 10 hours.

A sealed optical device produced by utilizing the curable composition according to one embodiment of the invention exhibits excellent transparency (i.e., does not show discoloration due to heat or light), and exhibits excellent heat resistance even when the optical device has an emission peak wavelength as short as 400 to 490 nm (e.g., white LED or blue LED).

EXAMPLES

The invention is further described below by way of examples and comparative examples. Note that the invention is not limited to the following examples.

Measurement of Weight Average Molecular Weight

The weight average molecular weight (Mw) (polystyrene-equivalent weight average molecular weight) of the silane compound polymer obtained in each production example was determined using the following device under the following conditions.

Device: HLC-8220 GPC manufactured by Tosoh Corporation
Column: TSKgel GMHXL, TSKgel GMHXL, and TSKgel 2000 HXL (that were sequentially connected)
Solvent: tetrahydrofuran
Injection amount: 80 μl
Temperature: 40° C.
Flow rate: 1 ml/min
Detector: differential refractometer
Measurement of IR Spectrum The IR spectrum of the silane compound polymer obtained in each production example was measured using a Fourier transform infrared spectrometer ("Spectrum 100" manufactured by PerkinElmer).

Production Example 1

A 300 ml recovery flask was charged with 71.37 g (400 mmol) of methyltriethoxysilane (manufactured by Shin-Etsu Chemical Co., Ltd.), followed by the addition of a phosphoric acid aqueous solution (prepared by dissolving 0.20 g (2 mmol) of phosphoric acid in 21.6 ml of distilled water) at 30° C. with stirring. After the addition of the phosphoric acid aqueous solution, the mixture was stirred at 30° C. for 2 hours, and stirred at 70° C. for 5 hours.

The organic layer was repeatedly washed with purified water until the pH of the aqueous layer reached 4, and concentrated using an evaporator. The concentrate was dried under vacuum to obtain 53.5 g of a silane compound polymer 1. The silane compound polymer 1 had a weight average molecular weight of 8,780 and a molecular weight distribution of 5.25.

The IR spectral data of the silane compound polymer 1 was as follows. Si—$CH_3$: 1272 $cm^{-1}$, 1409 $cm^{-1}$, Si—O: 1132 $cm^{-1}$ Production Example 2

A 100 ml recovery flask was charged with 9.62 g (50 mmol) of ethyltriethoxysilane (manufactured by Tokyo Chemical Industry Co., Ltd.), followed by the addition of a phosphoric acid aqueous solution (prepared by dissolving 0.025 g (0.25 mmol) of phosphoric acid in 2.7 ml of distilled water) at 30° C. with stirring. After the addition of the phosphoric acid aqueous solution, the mixture was stirred at 30° C. for 2 hours, and stirred at 70° C. for 5 hours.

The organic layer was repeatedly washed with purified water until the pH of the aqueous layer reached 4, and concentrated using an evaporator. The concentrate was dried under vacuum to obtain 5.9 g of a silane compound polymer 2. The silane compound polymer 2 had a weight average molecular weight of 2,150 and a molecular weight distribution of 1.96.

The IR spectral data of the silane compound polymer 2 was as follows. Si—$CH_2$—: 1253 $cm^{-1}$, 1415 $cm^{-1}$, —$CH_3$: 2882 $cm^{-1}$, 2964 $cm^{-1}$, Si—O: 1132 $cm^{-1}$ Production Example 3

A 100 ml recovery flask was charged with 10.32 g (50 mmol) of propyltriethoxysilane (manufactured by Tokyo Chemical Industry Co., Ltd.), followed by the addition of a phosphoric acid aqueous solution (prepared by dissolving 0.025 g (0.25 mmol) of phosphoric acid in 2.7 ml of distilled water) at 30° C. with stirring. After the addition of the phosphoric acid aqueous solution, the mixture was stirred at 30° C. for 2 hours, and stirred at 70° C. for 5 hours.

The organic layer was repeatedly washed with purified water until the pH of the aqueous layer reached 4, and concentrated using an evaporator. The concentrate was dried under vacuum to obtain 6.2 g of a silane compound polymer 3. The silane compound polymer 3 had a weight average molecular weight of 2,560 and a molecular weight distribution of 1.85.

The IR spectral data of the silane compound polymer 3 was as follows. Si—$CH_2$—: 1253 $cm^{-1}$, 1415 $cm^{-1}$, —$CH_3$: 2958 $cm^{-1}$, 2872 $cm^{-1}$, —$CH_2$—: 2931 $cm^{-1}$, Si—O: 1132 $cm^{-1}$ Example 1

1 part (part by mass, hereinafter the same) of 1,3,5-N-tris[3-(trimethoxysilyl)propyl] isocyanurate (component (B)) was added to 100 parts of the silane compound polymer 1 obtained in Production Example 1. The mixture was sufficiently mixed and defoamed to obtain a curable composition 1.

Examples 2 to 18 and Comparative Examples 1 to 5

Curable compositions 2 to 18 and 1r to 5r of Examples 2 to 18 and Comparative Examples 1 to 5 were obtained in the same manner as in Example 1, except that each component was used in the ratio shown in Table 1.

The meanings of the symbols A1 to A3, B1, and C1 in Table 1 are as follows.
A1: silane compound polymer 1
A2: silane compound polymer 2
A3: silane compound polymer 3
B1: 1,3,5-N-tris[3-(trimethoxysilyl)propyl] isocyanurate
C1: N,N'-bis[3-(trimethoxysilylpropyl)]urea

TABLE 1

|  | Component (A) (100 parts) | (B1) Amount (parts) | (C1) Amount (parts) |
|---|---|---|---|
| Example 1 | A1 | 1.0 | — |
| Example 2 | A1 | 5.0 | — |
| Example 3 | A1 | 10.0 | — |
| Example 4 | A1 | 15.0 | — |
| Example 5 | A1 | 30.0 | — |
| Example 6 | A1 | 50.0 | — |
| Example 7 | A1 | 60.0 | — |
| Example 8 | A1 | 80.0 | — |
| Example 9 | A1 | 10.0 | 0.3 |
| Example 10 | A1 | 10.0 | 0.5 |
| Example 11 | A1 | 10.0 | 1.0 |
| Example 12 | A1 | 10.0 | 5.0 |
| Example 13 | A1 | 10.0 | 10.0 |
| Example 14 | A1 | 10.0 | 15.0 |
| Example 15 | A2 | 10.0 | — |
| Example 16 | A2 | 10.0 | 1.0 |
| Example 17 | A3 | 10.0 | — |
| Example 18 | A3 | 10.0 | 1.0 |
| Comparative Example 1 | A1 | — | — |
| Comparative Example 2 | A2 | — | — |
| Comparative Example 3 | A3 | — | — |
| Comparative Example 4 | A1 | — | 1.0 |
| Comparative Example 5 | A1 | — | 5.0 |

The adhesion, the adhesion after the heat cycle test, the initial transmittance, and the transmittance after heating were measured as described below using the curable compositions 1 to 18 obtained in Examples 1 to 18 and the curable compositions 1r to 5r obtained in Comparative Examples 1 to 5 to evaluate the adhesion, the durability with respect to a change in temperature, the initial transparency, and the heat resistance (transparency after heating). The measurement results and the evaluation results are shown in Table 2.

Adhesion Test

The curable composition (curable compositions 1 to 18 obtained in Examples 1 to 18 and curable compositions 1r to 5r obtained in Comparative Examples 1 to 5) was applied to the mirror-finished surface of a silicon chip (2×2 mm) to a thickness of about 2 μm. The surface of the silicon chip to which the curable composition was applied was placed on an adherend (silver-plated copper sheet), and compression-bonded to the adherend. The curable composition was cured by heating at 170° C. for 2 hours to prepare a specimen-bonded adherend. After allowing the specimen-bonded adherend to stand for 30 seconds on the measurement stage of a bond tester ("Series 4000" manufactured by Dage Co., Ltd.) that had been heated to a given temperature (23° C. or 100° C.), the adhesion (N/2 mm square) (23° C. and 100° C.) between the specimen and the adherend was measured while applying stress (speed: 200 μm/s) to the bonding surface in the horizontal direction (shear direction) at a height of 50 μm above the adherend.

Evaluation of Durability with Respect to a Change in Temperature

A specimen-bonded adherend was prepared in the same manner as described above (see "Adhesion test"). The specimen-bonded adherend was subjected to a heat cycle test in 100 cycles (one cycle consists of an operation that holds the specimen-bonded adherend at −40° C. for 30 minutes, and then holds the specimen-bonded adherend at 100° C. for 30 minutes) using a thermal shock tester ("TSA-71S" manufactured by ESPEC Corporation). After the heat cycle test, the adhesion between the specimen and the adherend was measured at 23° C. in the same manner as described above.

A case where the adhesion between the specimen and the adherend measured after the heat cycle test was 60% or more with respect to the adhesion measured at 23° C. during the adhesion test was evaluated as "A", a case where the adhesion between the specimen and the adherend measured after the heat cycle test was 30% or more and less than 60% with respect to the adhesion measured at 23° C. during the adhesion test was evaluated as "B", and a case where the adhesion between the specimen and the adherend measured after the heat cycle test was less than 30% with respect to the adhesion measured at 23° C. during the adhesion test was evaluated as "C".

Measurement of Initial Transmittance

The curable composition (curable compositions 1 to 18 obtained in Examples 1 to 18 and curable compositions 1r to 5r obtained in Comparative Examples 1 to 5) was poured into a mold so as to have a length of 25 mm, a width of 20 mm, and a thickness of 1 mm, and cured by heating at 140° C. for 6 hours to prepare a specimen. The initial transmittance (%) (wavelength: 400 nm and 450 nm) of the specimen was measured using a spectrometer ("MPC-3100" manufactured by Shimadzu Corporation).

Measurement of Transmittance after Heating

The specimen (for which the initial transmittance had been measured) was allowed to stand in an oven at 150° C. for 500 hours, and the transmittance (%) (wavelength: 400 nm and 450 nm) of the specimen was measured. The transmittance thus measured was taken as the transmittance after heating.

TABLE 2

| | Curable composition | Adhesion (N/2 mm square) | | Durability with respect to change in temperature | Initial transmittance (%) | | Transmittance (%) after heating | |
|---|---|---|---|---|---|---|---|---|
| | | 23° C. | 100° C. | | 400 nm | 450 nm | 400 nm | 450 nm |
| Example 1 | 1 | 53.07 | 52.65 | A | 90.27 | 92.55 | 86.94 | 92.64 |
| Example 2 | 2 | 80.86 | 61.28 | A | 88.94 | 92.36 | 86.17 | 92.01 |
| Example 3 | 3 | 103.19 | 62.22 | A | 89.36 | 91.94 | 86.75 | 91.54 |
| Example 4 | 4 | 128.24 | 39.50 | A | 88.82 | 91.23 | 87.29 | 91.66 |
| Example 5 | 5 | 105.80 | 47.49 | A | 88.11 | 90.78 | 86.24 | 91.07 |
| Example 6 | 6 | 107.40 | 42.56 | A | 88.06 | 90.22 | 82.14 | 87.04 |
| Example 7 | 7 | 68.63 | 21.21 | A | 87.01 | 89.26 | 79.05 | 85.16 |
| Example 8 | 8 | 42.16 | 15.23 | A | 86.14 | 88.45 | 77.19 | 83.94 |
| Example 9 | 9 | 103.64 | 98.16 | A | 89.24 | 91.39 | 87.18 | 90.07 |
| Example 10 | 10 | 129.10 | 101.22 | A | 87.69 | 90.97 | 85.96 | 90.39 |
| Example 11 | 11 | 155.89 | 104.07 | A | 87.14 | 90.36 | 85.24 | 90.44 |
| Example 12 | 12 | 157.96 | 126.47 | A | 87.06 | 89.95 | 85.49 | 89.26 |
| Example 13 | 13 | 159.57 | 137.01 | A | 87.43 | 88.26 | 85.36 | 89.14 |
| Example 14 | 14 | 161.12 | 110.63 | A | 86.04 | 88.07 | 84.06 | 88.42 |
| Example 15 | 15 | 84.95 | 50.76 | A | 87.47 | 92.26 | 85.26 | 91.91 |
| Example 16 | 16 | 106.27 | 86.17 | A | 88.22 | 93.41 | 85.94 | 92.17 |
| Example 17 | 17 | 82.11 | 52.38 | A | 88.94 | 93.55 | 85.02 | 92.64 |
| Example 18 | 18 | 98.46 | 78.62 | A | 87.19 | 92.63 | 85.67 | 91.14 |
| Comparative Example 1 | 1r | 39.97 | 33.65 | C | 89.26 | 93.87 | 87.15 | 93.55 |
| Comparative Example 2 | 2r | 40.19 | 27.10 | C | 88.29 | 93.14 | 85.11 | 92.37 |
| Comparative Example 3 | 3r | 42.67 | 22.09 | C | 88.67 | 93.44 | 85.17 | 92.46 |
| Comparative Example 4 | 4r | 0.37 | 1.24 | C | 88.29 | 92.37 | 85.14 | 91.07 |
| Comparative Example 5 | 5r | 0.51 | 1.63 | C | 88.66 | 91.45 | 85.02 | 90.55 |

The following were confirmed from the results shown in Table 2.

The cured products of the curable compositions obtained in Examples 1 to 18 exhibited excellent adhesion, excellent durability with respect to a change in temperature, excellent initial transparency, and excellent transparency after heating. In particular, better adhesion was obtained when the component (C) was used in addition to the component (B) (see the results of Examples 9 to 14, 16, and 18).

The cured products of Comparative Examples 1 to 3 obtained by curing only the component (A) exhibited low adhesion and poor durability with respect to a change in temperature.

When the curable compositions of Comparative Examples 4 and 5 that did not include the component (B), and included the components (A) and (C) were cured, the advantageous effects of the invention were not obtained, and the resulting cured products exhibited significantly poor adhesion.

The invention claimed is:

1. A curable composition comprising a component (A) and a component (B) in a mass ratio (component (A): component (B)) of 100:0.3 to 100:90,
the component (A) being a silane compound polymer that is represented by a formula (a-1), $$(R^1SiO_{3/2})_m(R^1SiZO_{2/2})_n(R^1SiZ_2O_{1/2})_o \qquad (a\text{-}1)$$

wherein $R^1$ is a group selected from an alkyl group having 1 to 20 carbon atoms, a cycloalkyl group having 3 to 10 carbon atoms, and a substituted or unsubstituted aryl group having 6 to 20 carbon atoms, Z is a hydroxyl group, an alkoxy group having 1 to 10 carbon atoms, or a halogen atom, m is a positive integer, and n and o are independently 0 or a positive integer, provided that a plurality of $R^1$ are either identical or different, and a plurality of Z are either identical or different, and
the component (B) being a silane coupling agent that comprises an isocyanurate skeleton in its molecule.

2. The curable composition according to claim 1, wherein the silane compound polymer used as the component (A) has a weight average molecular weight of 1,000 to 30,000.

3. The curable composition according to claim 1, wherein the silane coupling agent used as the component (B) is a compound represented by a formula (b-1) or (b-2),

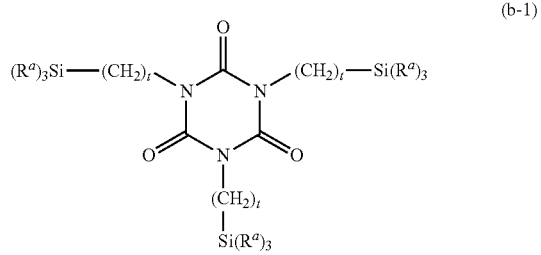

(b-1)

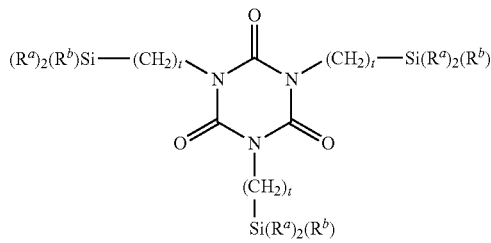

(b-2)

wherein $R^a$ are a hydroxyl group, an alkoxy group having 1 to 10 carbon atoms, or a halogen atom, $R^b$ are an alkyl group having 1 to 6 carbon atoms, or a substituted or unsubstituted aryl group, provided that a plurality of $R^a$ are either identical or different, and a plurality of $R^b$ are either identical or different, and t is an integer from 1 to 10.

4. The curable composition according to claim 1, further comprising a component (C), the component (C) being a silane coupling agent that comprises a urea structure in its molecule.

5. The curable composition according to claim 1, the curable composition being an optical device-securing composition.

6. A cured product obtained by curing the curable composition according to claim 1.

7. The cured product according to claim 6, the cured product being an optical device-securing material.

8. An optical device-securing adhesive prepared from the curable composition according to claim 1.

9. An optical device sealing material prepared from the curable composition according to claim 1.

* * * * *